(12) United States Patent
Jackson et al.

(10) Patent No.: US 6,683,322 B2
(45) Date of Patent: Jan. 27, 2004

(54) FLEXIBLE HYBRID MEMORY ELEMENT

(75) Inventors: Warren B. Jackson, San Francisco, CA (US); Carl Philip Taussig, Redwood City, CA (US); Craig Perlov, San Mateo, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 17 days.

(21) Appl. No.: 10/086,606
(22) Filed: Mar. 1, 2002
(65) Prior Publication Data
US 2003/0176034 A1 Sep. 18, 2003

(51) Int. Cl.[7] .............................................. H01L 35/24
(52) U.S. Cl. ......................................................... 257/40
(58) Field of Search .................................. 257/40, 288

(56) References Cited

U.S. PATENT DOCUMENTS

| | | | |
|---|---|---|---|
| 4,089,734 A | 5/1978 | Bierig | |
| 4,677,742 A | 7/1987 | Johnson | |
| 5,177,330 A | * 1/1993 | Takahashi et al. | 200/5 A |
| 5,541,869 A | 7/1996 | Rose et al. | 365/100 |

FOREIGN PATENT DOCUMENTS

| | | |
|---|---|---|
| EP | 1265286 | 12/2002 |
| WO | WO9939394 | 8/1999 |

OTHER PUBLICATIONS

Holtz K et al. "CAROM: A solid–state replacement for the CD–ROM" WESCON/97. Conference Proceedings Santa Clara, CA Nov. 1997, New York, NY, USA, IEEE, pp. 478–483 XP010254420.

* cited by examiner

Primary Examiner—David Nelms
Assistant Examiner—Quoc Hoang

(57) ABSTRACT

The invention includes a memory cell apparatus, and a method of forming the memory cell. The memory cell apparatus includes a flexible hybrid memory element. The flexible hybrid memory element includes a flexible first conductive layer formed adjacent to a flexible substrate. A flexible diode structure is formed adjacent to the flexible first conductor. A flexible switch is formed adjacent to the flexible diode structure. A flexible second conductive layer is formed adjacent to the flexible switch. The flexible switch is generally formed from an organic material. The flexible diode structure is generally formed from a disordered, inorganic material. The flexible switch can be formed to create a high resistance path when a threshold amount of current is passed through the flexible switch, or the flexible switch can be formed to create a low resistance path when a threshold amount of current is passed through the flexible switch. The method includes depositing a flexible first conductive layer on a flexible substrate. A flexible disordered inorganic material is deposited on the flexible first conductor forming a plurality of flexible diode structures. A flexible organic material is deposited on the flexible disordered inorganic material, forming a plurality of flexible switches adjacent to the plurality of flexible diode structures. A flexible second conductor is deposited on the flexible organic material.

16 Claims, 7 Drawing Sheets

FLEXIBLE HYBRID MEMORY ELEMENT

FIELD OF THE INVENTION

The invention relates generally to random access memory (RAM). More particularly, the invention relates to a flexible hybrid memory element including a flexible inorganic diode and a flexible organic switch.

BACKGROUND OF THE INVENTION

RAM devices generally include an array of memory cells. The memory cells are typically configured in rows and columns. Each row generally includes a corresponding word line, and each column generally includes a corresponding bit line. FIG. 1 shows an RAM array of memory cells 110, 120, 130, 140, and corresponding word lines (WL) and bit lines (BL). The RAM memory cells 110, 120, 130, 140 are located at cross-points of the word lines and the bit lines, and each RAM memory cells 110, 120, 130, 140 generally stores a bit of information.

The RAM memory cells 110, 120, 130, 140 include functionality for setting the RAM memory cells 110, 120, 130, 140 to one of at least two logical states. Each logical state represents a bit of information. Additionally, the RAM memory cells 110, 120, 130, 140 include functionality for sensing the logical state of each of the RAM memory cells 110, 120, 130, 140.

FIG. 2 shows a RAM memory cell 205 in greater detail. The RAM memory cell 205 generally includes a switch element 210 and a diode element 230. A state of the switch element can be set by the word lines (WL) and the bit lines (BL). The switch element 210 includes two states, each state corresponding to a logical setting. A first state (the switch element 210 being closed) corresponds to a low resistive state. A second state (the switch element 210 being open) corresponds to a high resistive state. The state of the switch, and therefore, the logical setting, can be determined by applying a voltage or current to the word lines (WL) and the bit lines (BL) and sensing the resulting resistance.

The switch element 210 generally includes a material that has a low initial electrical resistance that becomes a high electrical resistance upon passing of a sufficient amount of current (termed a fuse). Alternatively, the switch element 210 generally includes a material that has an initially high electrical resistance that becomes a low electrical resistance upon passing of sufficient current (termed an anti-fuse). Therefore, the resistive of the switch element 210, and therefore, the logical state is set by passing a sufficient amount of current through the switch element 210.

The diode element 230 is placed in series with the switch element 210 ensure that the resistance of only the selected RAM cell is sensed. Voltage potentials between the bit lines (BL) and the word lines (WL) are set so that only the diode element 230 of a selected RAM cell can be forward biased. The diode element 230 ensures that a selected RAM cell within an array of RAM cells does not include sneak paths. Sneak paths results when current conducted by RAM cells other than the selected RAM cell contribute to the current being sensed through the bit lines (BL) and word lines (WL). That is, the logical state of a selected RAM cell is determined by applying a voltage to the selected RAM cell, and sensing the resulting current flowing through the selected RAM cell, and therefore, the resistive state of the selected RAM cell. Without diode elements in series with the switch elements, other memory elements can contribute current (sneak paths) to the sensed current. The diode elements require the word lines (WL) and bit lines (BL) to be properly biased in order to select a particular RAM cell.

Prior art RAM memory cell configurations include switch elements fabricated from an oxide or amorphous silicon, and diode elements fabricated from crystalline silicon. Silicon is expensive and these structures are expensive to fabricate.

Other prior art RAM memory cell configurations include both the switch element and the diode element being formed from amorphous silicon. This configuration, however, can result in the diode element shorting out when the switch element is being set to a low resistance state. Once the diode element is shorted out, it no longer provides any benefits.

It is desirable to have an apparatus and method for providing inexpensive memory cell arrays that are inexpensive to fabricate. The memory cells should be robust. Setting the state of the switch should not cause a series diode to short out.

SUMMARY OF THE INVENTION

The invention includes an apparatus and a method for providing RAM memory elements that are cost effective to manufacture. Additionally, the RAM memory elements are robust.

A first embodiment of the invention includes a memory apparatus. The memory apparatus includes a flexible hybrid memory element. The flexible hybrid memory element includes a flexible first conductive layer formed adjacent to a flexible substrate. A flexible diode structure is formed adjacent to the flexible first conductor. A flexible switch is formed adjacent to the flexible diode structure. A flexible second conductive layer is formed adjacent to the flexible switch. The flexible switch is generally formed from an organic material. The flexible diode structure is generally formed from a disordered, inorganic material.

The flexible switch can be formed to create a high resistance path when a threshold amount of current is passed through the flexible switch, or the flexible switch can be formed to create a low resistance path when a threshold amount of current is passed through the flexible switch.

A second embodiment is similar to the first embodiment. The second embodiment further includes a buffer layer formed between the flexible switch and the flexible diode. The buffer layer generally dissipates energy generated by the flexible switch, thereby protecting the flexible diode.

A third embodiment is similar to the first embodiment. The third embodiment includes a plurality of memory elements, in which the memory elements are physically isolated from each other providing electrical isolation between the memory elements. Another embodiment includes the organic switch being anisotropic, thereby providing electrical isolation between the memory elements.

A fourth embodiment is similar to the first embodiment. The fourth embodiment includes the flexible first conductive layer and the flexible second conductive layer being patterned to form a cross-point array. The patterns of the flexible first conductive layer and the flexible second conductive layer can be aligned with patterns formed in the flexible diode structure and the flexible switch.

A fifth embodiment includes a method of forming a plurality of flexible hybrid memory elements. The method includes depositing a flexible first conductive layer on a flexible substrate. A flexible disordered inorganic material is deposited on the flexible first conductor forming a plurality of flexible diode structures. A flexible organic material is deposited on the flexible disordered inorganic material, forming a plurality of flexible switches adjacent to the plurality of flexible diode structures. A flexible second conductor is deposited on the flexible organic material.

Other aspects and advantages of the present invention will become apparent from the following detailed description, taken in conjunction with the accompanying drawings, illustrating by way of example the principles of the invention.

DETAILED DESCRIPTION

Figure 1:
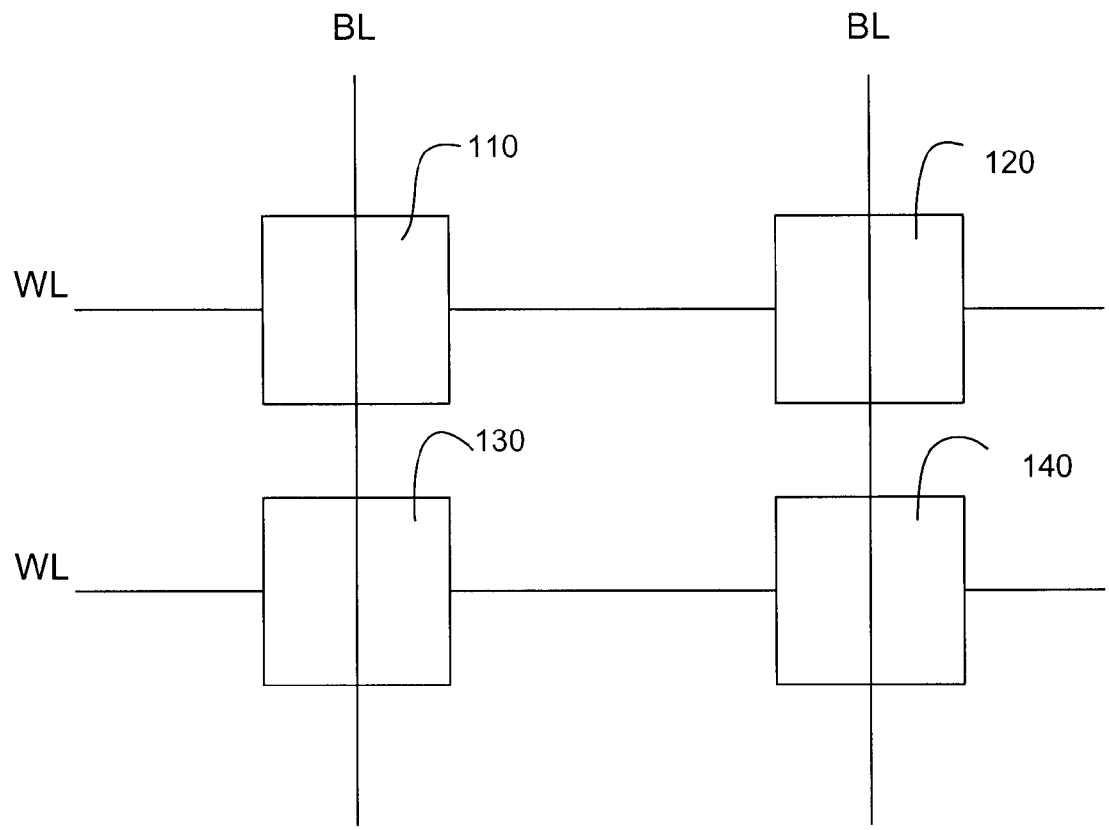
FIG. 1 shows a section of a prior art array of RAM memory cells.
Figure 2:
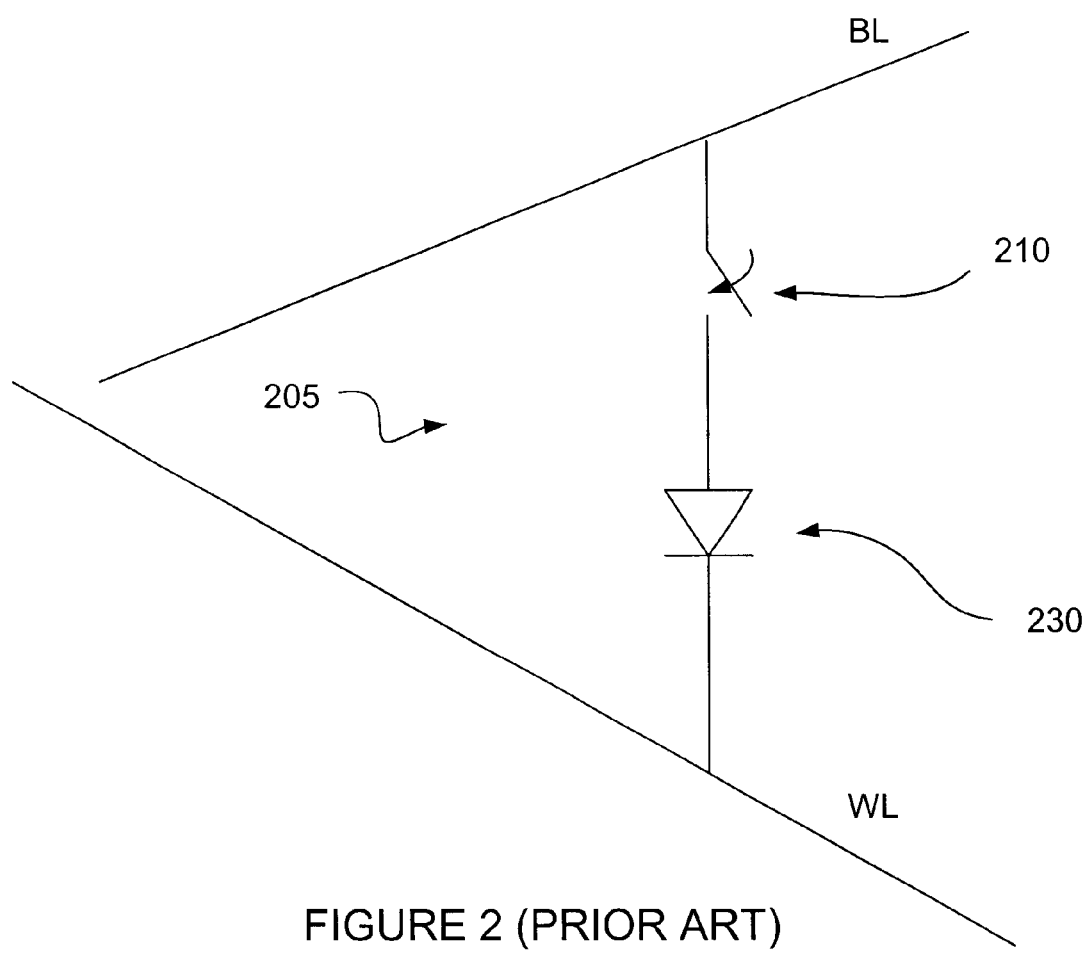
FIG. 2 shows an a prior art RAM memory cell with greater detail.

As shown in the drawings for purposes of illustration, the invention is embodied in an apparatus and a method for providing a RAM structure that is cost effective to manufacture.

Figure 3:
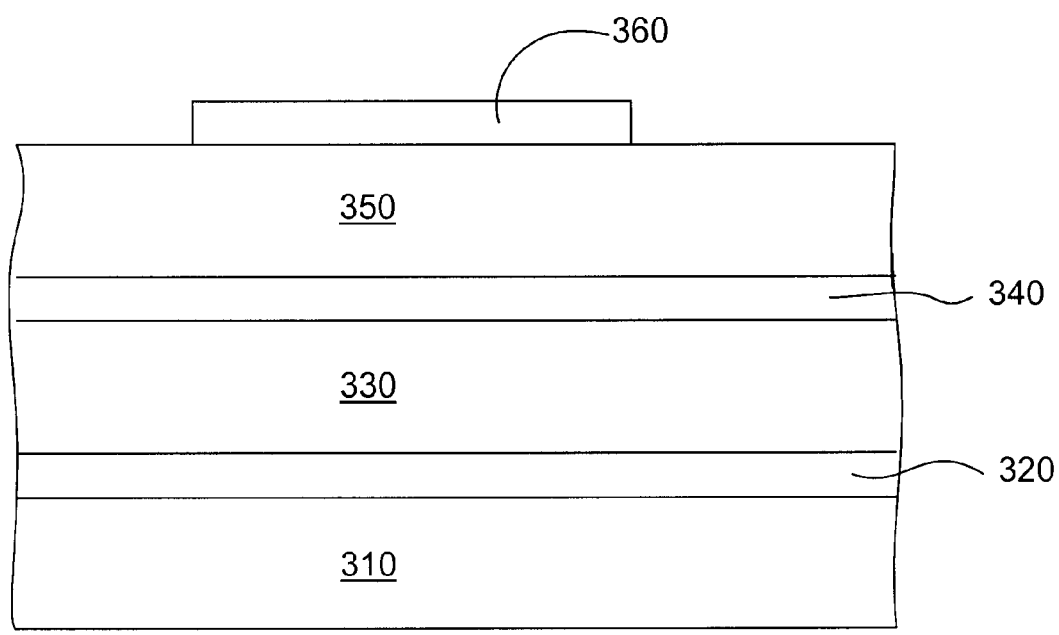
FIG. 3 shows an embodiment of the invention.

FIG. 3 shows an embodiment of the invention. This embodiment includes a substrate 310, a first conductive layer 320, a diode layer 330, a switch layer 350 and a second conductive layer 360. A buffer layer 340 can also be included. The substrate 310 and the layers 330, 320, 330, 350 form an array of memory elements.

The materials used to form the listed elements of FIG. 3 are generally adaptable to web based processing. Web based processing is a process for fabricating electronic circuitry that is generally less expensive than previous processing methods. Electronic elements are typically formed or deposited on a flexible substrate in a manner that is comparable to printing on newspaper. That is, the flexible substrate is typically unrolled from a source roll. The electronic elements are formed on the substrate at various processing points as the flexible substrate moves past the processing points, and is taken up on an uptake roll. The process is comparable to depositing ink on a newspaper. Patterning of the electronic elements can be accomplished by simple projection masking, followed by standard etching methods, embossing, contact masking and self-aligning processes. After the electronic elements have been formed, the substrate can be sectioned into individual integrated circuits. Generally, web based processing requires that the materials used to form the electronic elements and the substrate to be flexible.

The substrate 310, the first conductive layer 320, the diode layer 330, the switch layer 350 and the second conductive layer 360 should all be flexible to allow the layers to be formed through web based processing. The layers should be able to withstand a particular radius of curvature. Generally, the layers should be able to withstand a one to two inch radius of curvature. This includes multiple curvature flexing to allow the layers to be fabricated through web based processing.

The substrate 310 is generally formed from a flexible material that can withstand being subjected to the formation and processing steps of the electronic components to be formed on the substrate 310. The substrate 310 must be flexible in order for the memory array to be manufactured using a web based process. The substrate 310 is subjected to the processing temperatures of the subsequently formed electronic components (memory elements, bit lines and word lines). Therefore, the substrate must be able to withstand the processing temperatures required to form the electronic components. Typical processing temperatures can range from 100 to 300 degrees Celsius.

Possible substrate 310 material includes polyimide. The substrate 310 must be able to withstand the processing temperatures, processing chemicals and processes used to fabricate the electronics as well as the mechanical tension required during web based processing to keep the web (substrate) taught as the web (substrate) moves from the source roll to the uptake roll.

The first conductive layer 320 provides one of the electrical connections to the memory elements of the memory array. Generally, the first conductive layer 320 is formed as many substantially parallel conductive lines that provide the functionality of the previously described write lines or bit lines. Possible first conductive layer 320 materials includes stainless steel, chrome, titanium, molybdenum, copper or gold. The primary requirement of the material of the first conductive layer is that it can be deposited at temperatures compatible with the substrate 310, that it adhere to the substrate, and that it be sufficiently flexible to withstand the bending required during web processing. The first conductive layer 320 can be patterned using a photo-resist coating, exposure, and etching cycles similar to traditional photolithography. Other fabrication methods include embossing a liquid material followed by etching, die cutting, or gravure application of resists and/or etchants.

The diode layer 330 is generally deposited over the first conductive layer 320. The diode layer 330 is generally a non-crystalline material such as amorphous silicon, amorphous carbon, amorphous silicon carbon, amorphous germanium, amorphous silicon germanium or microcrystalline silicon. It is to be understood that that this list is not exhaustive.

The diode layer 330 can include p-i-n or Schottky diodes. If the diode layer 330 forms p-i-n diodes, then the diode layer 330 includes a p-type layer, and intrinsic layer and an n-type layer.

Generally, the n-layer of amorphous silicon is deposited over the conductive layer 320. Typically, a plasma enhanced chemical vapor deposition process (PECVD) is used to deposit the n-layer.

The i-layer is generally formed from a hydrogenated amorphous silicon. The i-layer can be deposited using a PECVD or reactive sputtering process. The PECVD process must include a silicon containing gas. The deposition should be at a low enough temperature that hydrogen is retained with the film.

The p-layer is generally formed from amorphous silicon. Typically, the p-layer is doped with Boron. The p-layer can be deposited using PECVD. The PECVD is perfonmed with a Boron containing gas. A silicon containing gas is included when forming an amorphous silicon p-layer.

As previously described, the n-layer, the i-layer and the p-layer are generally formed from amorphous silicon. However, the n-layer, the i-layer and the p-layer can also be formed from amorphous carbon, amorphous silicon carbide, amorphous germanium, or amorphous silicon-germanium. It is to be understood that this list is not exhaustive.

Another embodiment includes Schottky diodes. Schottky diodes can include several different configurations. A first Schottky diode configuration includes the n-layer of the above-described p-i-n diode by replaced with a conductive metal. This configuration also includes the i-layer and the p-layer. A second Schottky diode configuration includes the n-layer being replaced with a conductive layer, and the p-layer being replaced with a conductive layer. Conductive metals that can be used for the conductive layers of the Schottky diode configurations include chrome, platinum, aluminum and titanium. The conductive layers of the Schottky diode configurations must be patterned to avoid leakage between neighboring memory cells.

The switch layer 350 is formed over the diode layer 330. The switch layer 350 essentially forms switches that are in series with diodes of the diode layer 330. The switch layer 350 essentially provides a high resistance path when in a first state, and a less resistive path if in a second state. The switch layer 350 generally includes an organic material having a low initial electrical resistance that becomes a high electrical resistance upon passing of a sufficient amount of current (termed a fuse), or an organic material having an initially high electrical resistance that becomes a low electrical resistance upon passing of sufficient current (termed an anti-fuse).

The portion of the switch layer 350 nearest to the second conductive layer 360 can be processed to promote carrier injection properties. This portion should include a low contact resistance. Developing organic layers that include a low contact resistance is well understood in the field of material science.

The second conductive layer 360 is formed over the switch layer 350. The second conductive layer 360 provides the opposite side electrical connections to the memory elements of the memory array as the first conductive layer 320. Generally, the second conductive layer 360 is formed as many substantially parallel conductive lines that provide the functionality of the previously described write lines or bit lines. Possible second conductive layer 360 materials includes calcium, platinum, titanium, and other electrode materials that make good injection contacts with organic materials. The primary requirement of the material of the second conductive layer 360 is that it provides a good electrical contact with the organic layer. It is also important that the second conductive layer 360 be deposited at temperatures compatible with the switch layer 350. The second conductive layer 360 should adhere to the switch layer 350, and be sufficiently flexible to withstand the bending required during web processing. The second conductive layer 360 can be patterned using a photo-resist coating, exposure, and etching cycles similar to traditional photolithography. Other fabrication methods include embossing a liquid material followed by etching, die cutting, or application of resists and/or etchants.

Contact conductors can be included between the first conductive layer 320 and the substrate, and between the second conductive layer 360 and the switch layer 350. Contact conductors are well know in the field of material science.

The resistive state (high or low) of the switch layer 350 determines a logical state of a corresponding memory element within the array of memory elements. Each memory element includes a first electrode formed by the first conductive layer 320, and a second electrode formed by the second conductive layer 360, a switch layer 350 and diode layer 330. The logical state of each memory element is determined by applying a voltage or current to the first electrode, and measuring the resulting current passing through or the resulting voltage developed on the second electrode associated with the memory element to determine the resistive state of the memory element. The current or voltage applied should be large enough to provide a sufficient signal-to-noise ration to measure the resistive state, but should be small enough to avoid switching the logical state of the memory element. The resistive state of a memory element is set by a corresponding organic switch element within the switch layer 350. A corresponding diode element within the diode layer 330 retains its rectifying properties, which remain unchanged by the state of the organic switch elements. The diode elements ensure that the resistance of only the selected memory element is sensed, thereby eliminating sneak paths, and reducing the overall power consumption of the memory array.

When a sufficiently large voltage or current is applied to the first electrode and the second electrode, the organic switch layer 350 changes its electronic properties. That is, a resistance across the organic switch layer 350 changes radically, thereby setting the logical state of the corresponding organic switch element. The diode elements of the diode layer 330 retain their rectifying properties, unchanged by the state of the organic switch elements. Ideally, the voltages required to change the resistive state of the organic switch layer 350 is 0.5 to 3 volts, thereby matching the typical supply voltages. The currents required to change the resistive state of the diode layer 330 should be $10^{-5}$ amps or less. The impedance (resistance) of the organic switch layer 350 after transitioning to a high impedance state should be on the order of mega-ohms.

Figure 4:
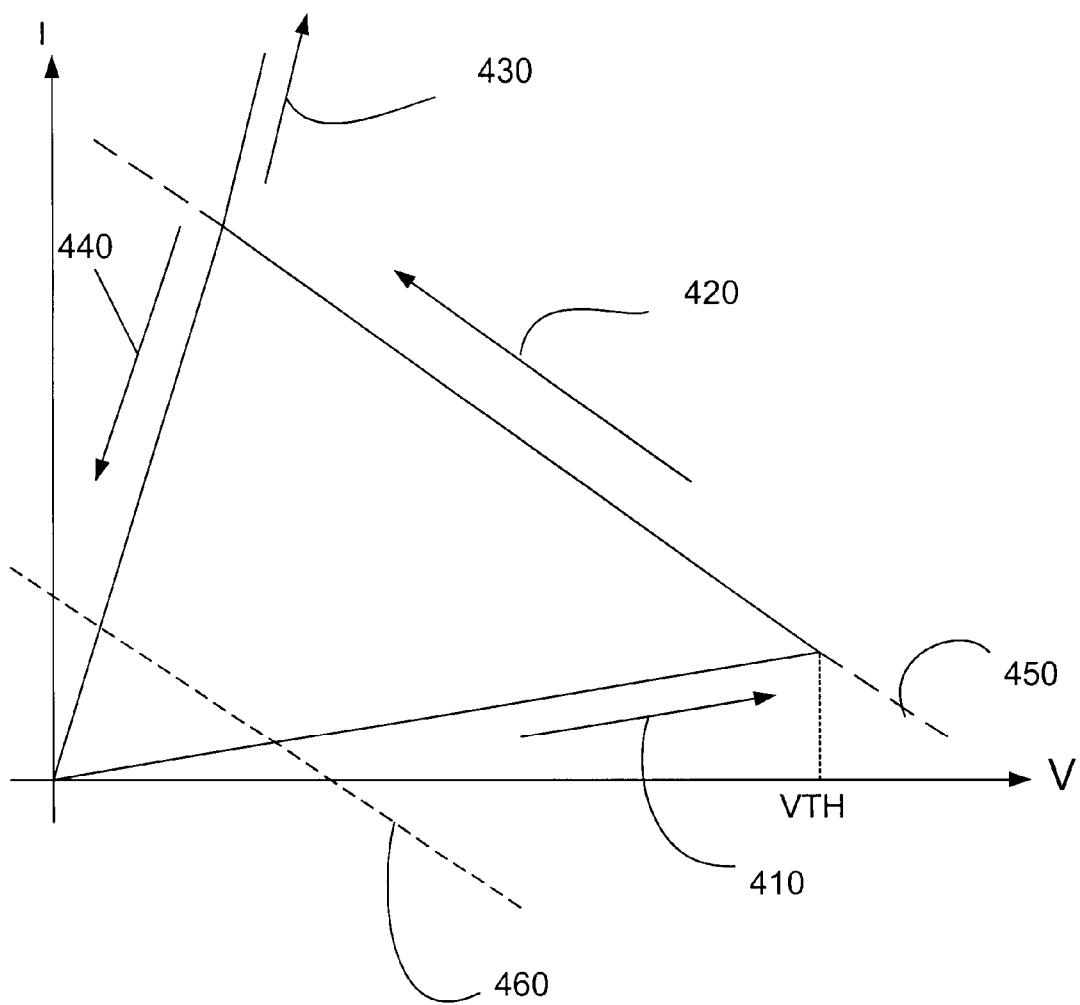
FIG. 4 shows a write load line and a read load line of a memory element according to the invention.

FIG. 4 shows a write load line 450 and a read load line 460 of a memory element according to the invention. FIG. 4 is a plot that depicts a current versus voltage relationship of the memory element. For an embodiment, the memory element depicts a high-impedance characteristic. Arrow 410 depicts this characteristic. As the voltage across the memory element increases to a voltage threshold (VTH), the organic switch layer experiences a drastic change in its electrical properties. This change is depicted by the arrow 420, and follows the write load line 450. The memory element after the change in electrical properties is in a low impedance state. Arrow 430 depicts an increase in the voltage across the memory element and the resulting current when the memory element is in the low impedance-state. Arrow 440 depicts a decrease in the voltage across the memory element and the resulting current when the memory element is in the low impedance-state. The impedance, and therefore, the logical state of the memory element can be detected as shown by the read load line 460. The example shown in FIG. 4 is for the anti-fuse configuration of the invention. It is to be understood that the fuse configuration includes similar features, except the I-V relationship of the curves is interchanged.

As previously stated, the switch elements of the switch layer 350 provide a high resistance electrical characteristic upon passing of a sufficient amount of current (a fuse), or the organic material forms a low resistance upon passing of sufficient current (an anti-fuse). Antifuses generally require less energy to switch states because only a small conductive channel is required to lower the resistance. In order to increase the resistance, the entire area or volume of the switch material must be altered in order to decrease the total current flow. Fuses are generally preferred from a system level because less power is conducted as more fuses are blown. If there are no shorts during fabrication, the fuse type of switch will decrease the amount of current conducted, and therefore, decrease the amount of current even if a particular memory element fails.

The embodiment shown in FIG. 3 can suffer from leakage between neighboring memory elements. The memory elements share the common diode layer 330 and switch layer 350. Therefore, it is possible for leakage to occur between neighboring switch elements. Large leakage currents can greatly increase the power required by the memory elements.

Leakage currents between memory elements can be minimized by patterning the diode layer 330 and the switch layer 350, as will be described later. However, patterning requires additional fabrication and processing steps, and therefore, adds costs. Alternatively, the switch layer 350 can be fabricated using an anisotropic material. That is, the switch layer can be fabricated so that the resistance between switch elements is much greater than the resistance across each switch element. This is advantageous because the processing steps associated with patterning of the switch layer are avoided.

Materials that can be used to form the switch layer 350 parylene, polyacetalene, polyparaphenylene, polypyrrole, polyyaniline and andaminopyridine. These materials are provided as examples, not as an exhaustive list. Through appropriate deposition methods, including electropolymerization and Langmuir-Blodgett deposition, these polymer molecules can be made to align normal to the surface. The conductivity can be made anisotropic as the conductivity can be made greater along the molecules of the materials than across the molecules of the materials.

An embodiment of the invention includes the organic switch layer 350 formed over the inorganic diode layer 330. Generally, organic materials are not formed adjacent to inorganic materials because typically it is desirable that adjacent materials share common characteristics. That is, generally it is easier and less expensive to adjacently form similar materials. It is also typical to desire the organic and inorganic materials to be good conductors. However, an embodiment of the invention (anti-fuse) includes the organic material being a poor conductor.

The invention can also include a buffer layer 340. The buffer layer 340 is optionally included to dissipate energy generated by the high resistance switch elements of the switch layer 350 for protecting the diode elements of the diode layer 330. The buffer layer can be formed from a metal, a thin semiconductor or and insulator. The buffer layer 340 must include a low resistance to current flowing through the each memory element. The buffer layer 340 helps prevent destruction of the diode layer 330. Generally, conductivity through the buffer layer 340 between memory elements should be low. The buffer layer 340 can be patterned to minimize conductivity between memory elements.

Figure 5:
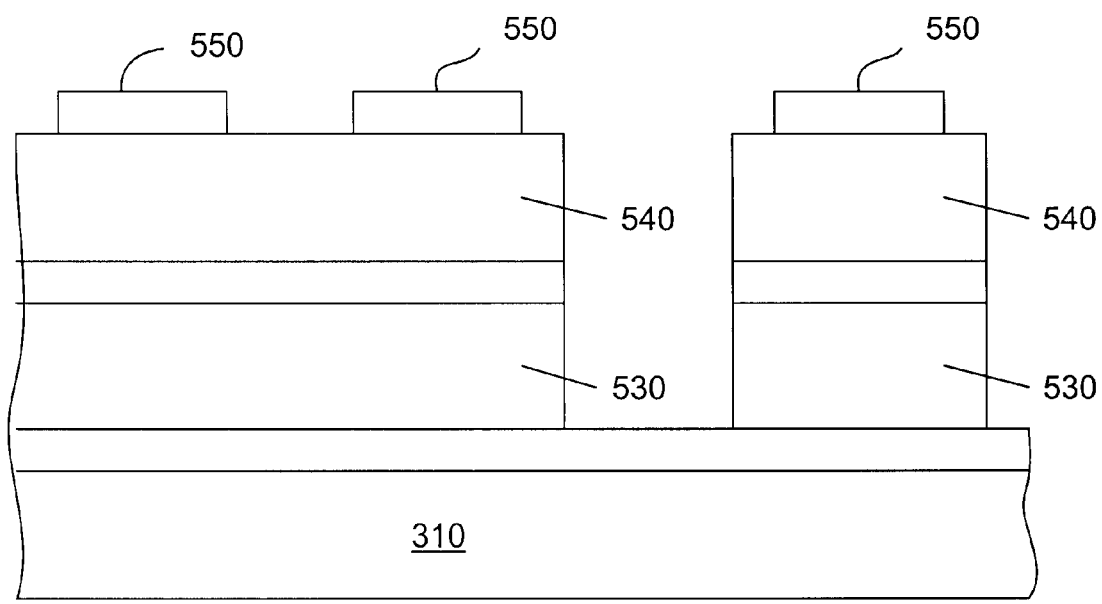
FIG. 5 shows another embodiment of the invention.

FIG. 5 shows another embodiment of the invention. This embodiment is similar to the embodiment of FIG. 3. However, several of the layers have been patterned to provide isolation between the memory elements. The first conductive layer 320 is formed on the substrate 310. A sectioned diode layer 530, a sectioned switch layer 540 and second conductor layer 550 are formed over the substrate 310 and first conductive layer 320.

The embodiment of FIG. 5 can provide better performance than the embodiment of FIG. 3. That is, the improved isolation between the memory elements greatly reduces leakage currents between the switch elements of the memory devices. However, this embodiment is generally more expensive and difficult to fabricate.

Figure 6:
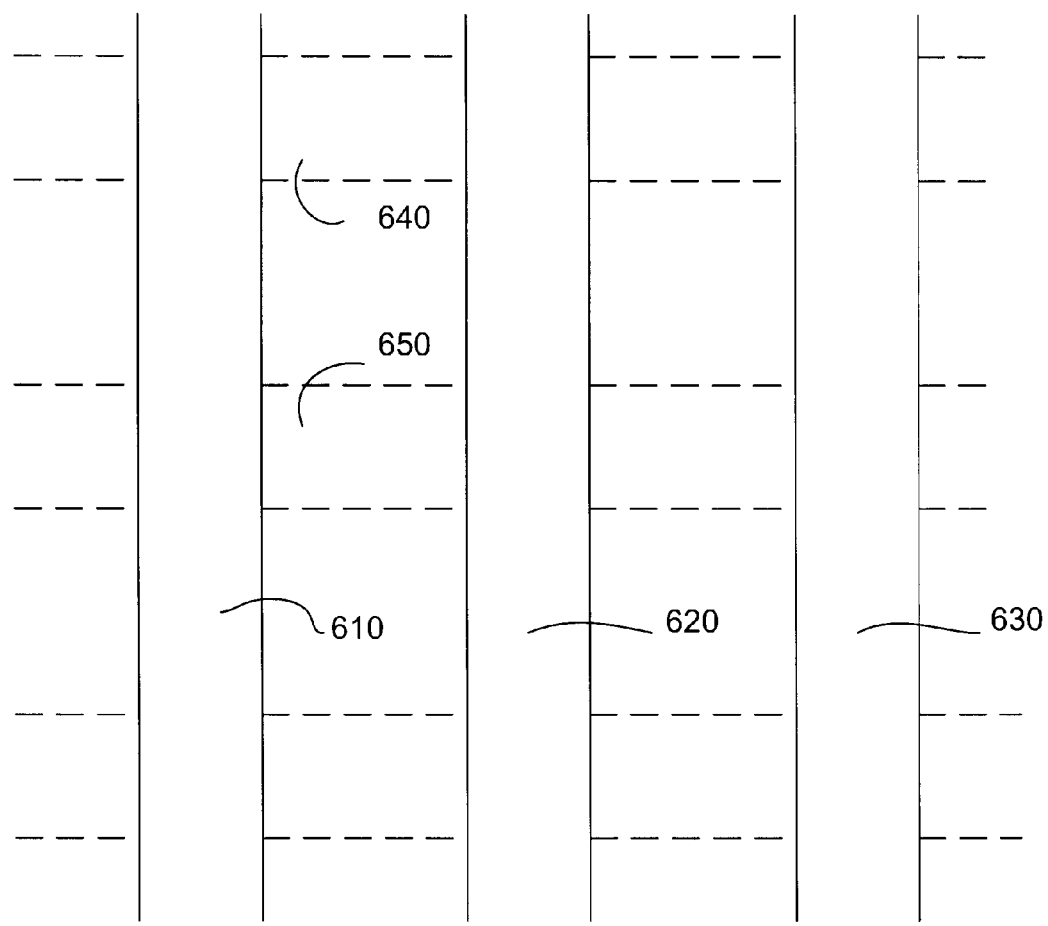
FIG. 6 shows conductive layers that can be used for self-aligning memory elements during fabrication of the memory elements according to the invention.

FIG. 6 shows conductive layers that can be used for self-aligning memory elements during fabrication of the memory elements according to the invention. An upper conductive layer (equivalent to the second conductive layer) includes upper conductive lines 610, 620, 630. A lower conductive layer (equivalent to the first conductive layer) includes lower conductive lines 640, 650, 660. Once, for example, the lower conductive lines 640, 650, 660 have been formed, the lower conductive lines 640, 650, 660 can be intimately used in the formation of the diode elements and switch elements of a memory array. For example, the substrate can be transparent. Lower conductive lines 640, 650, 660 formed on the transparent substrate can be used in conjunction with photo resist to selectively etch layers of the memory elements subsequently deposited over the lower conductive lines 640, 650, 660 an the substrate.

Figure 7:
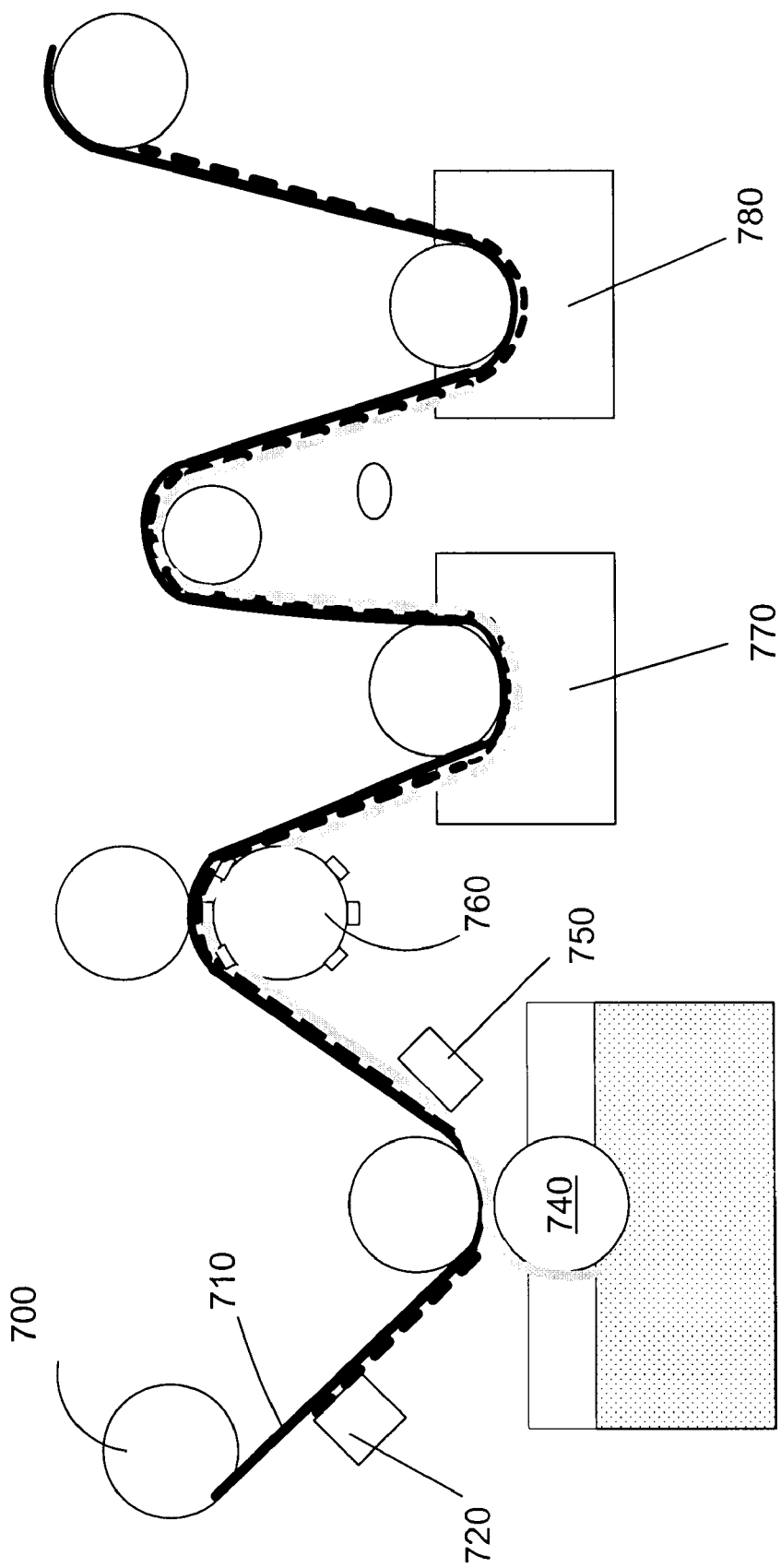
FIG. 7 shows a web base process that can be used to fabricate embodiments of arrays of memory elements according to the invention.

FIG. 7 shows a web processor that can be used to form embodiments of the invention. A source roll 700 is a source of a flexible substrate 710. The flexible substrate 710 is unrolled from the source roll, for deposition and processing to form the RAM elements.

A layer deposition module 720 deposits requisite layer materials. To provide patterning of the layer materials, a resist can be applied to the layer materials. The resist can be applied by passing the flexible substrate 710 through a resist application roller 740. The resist application roller 640 applies a resist from a resist bath 730. A doctor blade 650 ensures that the resist is uniformly applied. A pattern imprinting or embossing roller 760 applies a pattern to the resist. An etchant bath 770 removes the layer materials according to the pattern of the resist. Finally, the resist is removed by passing the flexible substrate through a resist removal bath 780. The finished devices end up on a uptake roll 790. Clearly, this process requires materials that can flex (bend) around the curves of the rollers. Additionally, the materials must withstand the tensional forces required by this process.

Although specific embodiments of the invention have been described and illustrated, the invention is not to be limited to the specific forms or arrangements of parts so described and illustrated. The invention is limited only by the appended claims.

What is claimed:

1. A memory apparatus, the memory apparatus comprising a flexible hybrid memory element comprising:

a flexible first conductive layer formed adjacent to a flexible substrate;

a flexible diode structure formed adjacent to the flexible first conductor;

a flexible switch layer formed adjacent to the flexible diode structure, the flexible switch layer providing a high resistance path when in a first state, and a less resistive path if in a second state, wherein electrical properties of the flexible switch layer for the first state are different than electrical properties of the flexible switch layer for the second state; and a flexible second conductive layer formed adjacent to the flexible switch.

2. The flexible hybrid memory element of claim 1, wherein the flexible switch layer comprises an organic material.

3. The flexible hybrid memory element of claim 2, wherein the flexible organic switch layer forms a high resistance path when a threshold amount of current is passed through the flexible organic switch layer.

4. The flexible hybrid memory element of claim 2, wherein the flexible organic switch layer forms a low resistance path when a threshold amount of current is passed through the organic switch layer.

5. The flexible hybrid memory element of claim 2, wherein a switch process temperature required to form the flexible organic switch layer is less than a diode process temperature required to form the flexible diode structure.

6. The flexible hybrid memory element of claim 2, further comprising a buffer layer formed between the flexible organic switch layer and the flexible diode structure.

7. The flexible hybrid memory element of claim 6, wherein the buffer layer dissipates energy generated by the flexible organic switch layer, thereby protecting the flexible diode structure.

8. The flexible hybrid memory element of claim 2, wherein the flexible organic switch layer is formed from at least one of polypyrrole, parylene, polyacetalene, polyparaphenylene, polyaniline and andaminopyridine.

9. The flexible hybrid memory element of claim 1, wherein the flexible diode structure comprises a disordered inorganic material.

10. The flexible hybrid memory element of claim 9, wherein the flexible diode structure is formed from at least one of amorphous silicon, microcrystalline silicon, amorphous silicon germanium.

11. The flexible hybrid memory element of claim 1, wherein the flexible diode structure comprises a non-organic, non-crystalline material.

12. The memory apparatus of claim 1, further comprising a plurality of hybrid memory elements.

13. The memory apparatus of claim 12, wherein the hybrid memory elements are physically isolated from each other providing electrical isolation between the hybrid memory elements.

14. The memory apparatus of claim 12, wherein the flexible organic switch layer is anisotropic, thereby providing electrical isolation between the hybrid memory elements.

15. The memory apparatus of claim 1, wherein the flexible first conductive layer and the flexible second conductive layer are patterned forming a cross-point array.

16. The memory apparatus of claim 15, wherein patterns of the flexible first conductive layer and the flexible second conductive layer are aligned with patterns formed in the flexible diode structure and the flexible organic switch layer.

* * * * *